(12) United States Patent
Kobayashi et al.

(10) Patent No.: US 7,019,659 B2
(45) Date of Patent: Mar. 28, 2006

(54) NETWORK SYSTEM, MANAGING SERVER, ELECTRICAL APPARATUS, BATTERY STATUS MANAGING METHOD, BATTERY DIAGNOSIS METHOD, AND PROGRAM THEREOF

(75) Inventors: Masaki Kobayashi, Tokyo (JP); Atsushi Kumaki, Yokohama (JP); Shigefumi Odaohhara, Yamato (JP)

(73) Assignee: Lenovo Pte. Ltd, Centrel (SG)

( * ) Notice: Subject to any disclaimer, the term of this patent is extended or adjusted under 35 U.S.C. 154(b) by 575 days.

(21) Appl. No.: 10/304,906

(22) Filed: Nov. 26, 2002

(65) Prior Publication Data

US 2003/0105601 A1 Jun. 5, 2003

(30) Foreign Application Priority Data

Nov. 26, 2001 (JP) ............................. 2001-359735

(51) Int. Cl.
*G08B 21/00* (2006.01)

(52) U.S. Cl. .................... 340/636.1; 320/107; 702/182

(58) Field of Classification Search ........... 340/870.07, 340/635, 636.1; 320/107, 111, 114; 700/11, 700/17; 702/182, 183, 186

See application file for complete search history.

(56) References Cited

U.S. PATENT DOCUMENTS

| 4,553,081 | A | * | 11/1985 | Koenck ....................... 320/131 |
| 6,794,849 | B1 | * | 9/2004 | Mori et al. .................. 320/107 |
| 2002/0156537 | A1 | * | 10/2002 | Sakakibara et al. ............ 700/1 |
| 2003/0015993 | A1 | * | 1/2003 | Misra et al. ................. 320/125 |
| 2003/0033550 | A1 | * | 2/2003 | Kuiawa et al. ............. 713/340 |

FOREIGN PATENT DOCUMENTS

JP  2001-242971  9/2001

* cited by examiner

*Primary Examiner*—Timothy Edwards
(74) *Attorney, Agent, or Firm*—Kunzler & Associates (57) ABSTRACT

A network system in which an electrical apparatus having a battery which performs charges and discharges to supply electric power to the electrical apparatus and a managing server are connected by the network and perform a diagnosis of the battery provided for the electrical apparatus. The electrical apparatus accesses a Web page provided by the managing server through the network and then transmits an information file about the battery to the managing server. The managing server reads the information file to analyze the information about the battery and then transmits the analytical results to the electrical apparatus.

21 Claims, 6 Drawing Sheets

NETWORK SYSTEM, MANAGING SERVER, ELECTRICAL APPARATUS, BATTERY STATUS MANAGING METHOD, BATTERY DIAGNOSIS METHOD, AND PROGRAM THEREOF

FIELD AND BACKGROUND OF INVENTION

The present invention relates to a network system for managing a user terminal and, more particularly, to a network system for performing a diagnosis or other management operations of a battery provided for the user terminal.

Information terminal apparatuses including a notebook personal computer (notebook PC), personal apparatuses such as a personal digital assistant (PDA), various portable audio apparatuses, and various electrical apparatuses such as a video camera are provided with power, for example, not only by direct supply of utility power through an AC adapter but also from batteries (storage batteries, secondary batteries, batteries) which are reusable again and again by repeating charges and discharges. These batteries include a nickel metal hydride battery (NiMH battery) and a nickel cadmium battery (NiCd battery) because of relatively large capacities and low prices. Such batteries also include a lithium-ion battery, which has a higher energy density per unit weight as compared with a nickel cadmium battery and a lithium polymer battery, which uses a solid polymer instead of a liquid electrolyte are also adopted.

For example, if a notebook PC user (customer) encounters a problem with a battery provided for the notebook PC, the user will make an inquiry at a technical service center for customer support. Then, if the technical service center determines that the battery needs replacing, a battery for replacement will be delivered to the customer under instructions from the technical service center.

However, many operators in the technical service center have expert knowledge of basic operations for notebook PCs but little expert knowledge of batteries. Therefore, it is difficult for such an operator to determine whether a battery is under normal operating conditions or whether the battery needs replacing, and practically, a replacement battery may be supplied to the customer regardless of whether the battery functions normally.

Moreover, it is difficult for the user to know battery-specific usages or battery-specific degradation factors. Even if the operator in the technical service center has expert knowledge of batteries, the user cannot accurately inform the operator of factors that cause a battery fault. As a result, the operator cannot give appropriate guidance to the user and thus it is difficult for the operator to provide correct information and optimum solutions.

SUMMARY OF THE INVENTION

The present invention has been made to solve these technical problems and it is an purpose thereof to give the user appropriate guidance on diagnosis results and effective usages of a battery.

It is another purpose to reduce inquiries about battery troubles as well as to reduce operator jobs so that the load on the technical service center is reduced.

It is still another purpose to collect basic data for a battery under the user's operating conditions.

To attain these purposes, a network system according to the present invention comprises: an electrical apparatus connected to a network and having a battery which performs charges and discharges to supply electric power to the electrical apparatus; and a managing server connected to the network and performing a diagnosis of the battery provided for the electrical apparatus, wherein the electrical apparatus accesses a Web page provided by the managing server through the network, that is, the electrical apparatus uses a browser to access a Web page which is provided by the managing server and specifies a URL which exists in an HTML document transmitted by the managing server, and then the electrical apparatus transmits an information file about the battery to the managing server, and the managing server reads the information file to analyze the information about the battery and then transmits the analytical results to the electrical apparatus.

It is preferable that the managing server analyzes the status of the battery and determines whether the battery is under warranty, and more specifically, the managing server determines whether the battery is under warranty, based on some information about the service starting date of the battery which is stored in the information file, and thus, the managing server can automatically proceed to a delivery process if a fault condition is detected while the battery is under warranty.

On one hand, the present invention is a managing server which performs through a network a diagnosis of a battery connected to an electrical apparatus, and the managing server comprises: information file reading means for reading an information file about the battery which is stored in the electrical apparatus; battery information analysis means for performing an information analysis including a fault diagnosis and/or a degradation diagnosis of the battery, based on the information file read by the information file reading means; and result output means for providing analytical results from the battery information analysis means to the electrical apparatus.

On the other hand, the present invention can be an electrical apparatus having a battery to be diagnosed. Namely, an electrical apparatus according to the present invention comprises: battery information acquisition means for acquiring a variety of information about a battery which supplies electric power to the electrical apparatus; storage means for storing as an information file the variety of acquired information about the battery; transmission means for transmitting the stored information file to a managing server through a network; reception means for receiving analytical results based on the transmitted information file from the managing server through the network; and indication means for providing indications to give the user some guidance on usages of the battery based on the received analytical results.

From other viewpoints, the present invention is a battery status managing method for managing the status of a battery which is configured to be able to connect to an electrical apparatus and supplies electric power to the electrical apparatus. The method comprises the steps of: acquiring some information used to perform a degradation diagnosis of the battery and some information used to determine a degradation factor for the battery; storing the acquired information; transmitting the stored information through a network to a managing server which performs a diagnosis and a status determination of the battery; and receiving the results of a degradation diagnosis and/or a degradation factor determination from the managing server through the network.

It is preferable that the information used for the degradation diagnosis is full charge capacity information of the battery and the information used for the degradation factor determination is usage information at a specific range of temperatures and/or usage information at a specific range of voltages, since it is possible to diagnose the degradation of the battery while considering characteristics of the battery which may be degraded progressively in a high-temperature environment or during a prolonged high-voltage period.

In addition, the present invention is also a battery diagnosis method for performing a diagnosis of a battery provided for an electrical apparatus connected through a network. The method comprises the steps of: reading an information file about the battery which is acquired through the network; comparing a full charge capacity of the battery which is acquired from the read information file with a predetermined guaranteed capacity; determining whether the battery is under warranty, if the full charge capacity of the battery is lower than the guaranteed capacity; and performing a process for battery replacement such as providing delivery information for the battery, if the battery is under warranty.

Another battery diagnosis method according to the present invention comprises the steps of: collecting historical data for a battery which is acquired from a read information file; and providing to an electrical apparatus through a network necessary guidance for the customer to use a battery, based on the collected historical data.

The present invention can be a program for causing a computer which performs a diagnosis of a battery provided for an electrical apparatus connected through a network to implement predetermined functions. The program performs the functions for: reading an information file about the battery which is acquired through the network; comparing a full charge capacity of the battery which is acquired from the read information file with a predetermined guaranteed capacity; determining whether the battery is under warranty, if the full charge capacity of the battery is lower than the guaranteed capacity; and performing a process for battery replacement, if the battery is under warranty.

Another program according to the present invention performs the functions for: reading an information file about the battery which is acquired through the network; collecting historical data for service time and/or service voltage of the battery which is acquired from the read information file; and providing to the electrical apparatus through the network necessary guidance for the customer to use a battery, based on the collected historical data.

Furthermore, each of these programs may be provided in the form of a computer-readable storage medium which stores the program so that the computer can execute it. Such a storage medium may include, for example, a CD-ROM, from which a CD-ROM drive of the computer read the program and stores it, for example, on a hard disk provided with a computer at a managing server for execution. Alternatively, each of these programs may be provided, for example, by a program transmission device to the computer at the managing server through the network. The program transmission device essentially has a memory for storing the program and program transmission means for providing the program through the network.

BRIEF DESCRIPTION OF DRAWINGS

Some of the purposes of the invention having been stated, others will appear as the description proceeds, when taken in connection with the accompanying drawings, in which.

DETAILED DESCRIPTION OF INVENTION

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of the invention. Accordingly, the description which follows is to be understood as being a broad, teaching disclosure directed to persons of skill in the appropriate arts, and not as limiting upon the present invention.

Figure 1:
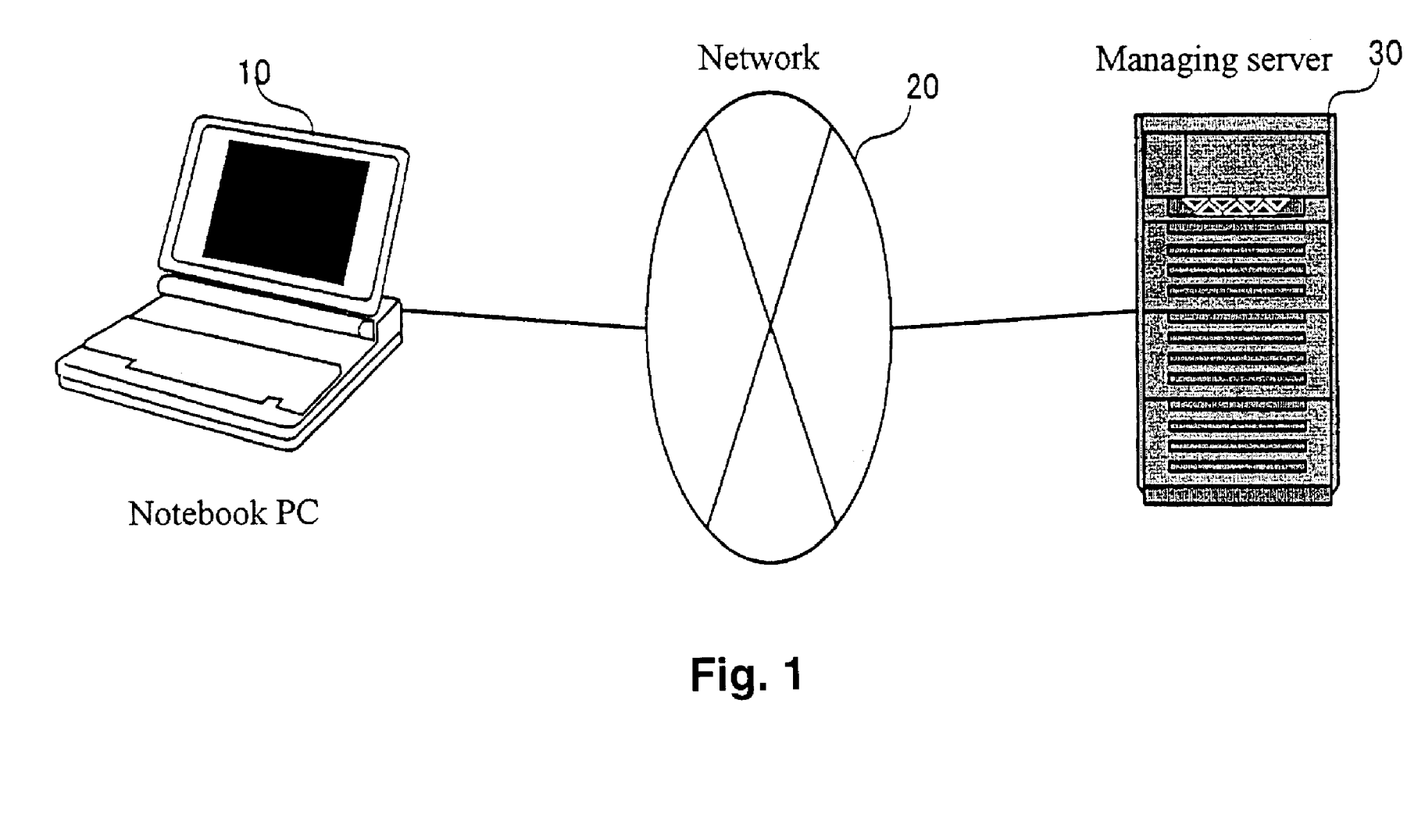
FIG. 1 shows the configuration of a network system according to the embodiments of the present invention.

FIG. 1 shows the configuration of a network system according to the embodiments of the present invention. In this network system, a notebook PC (notebook personal computer) 10 is connected to a network 20 such as the Internet. The notebook PC 10 is an electrical apparatus provided with a battery which is charged and then discharges to supply electric power to the electrical apparatus. A managing server 30 for managing the notebook PC 10 is also connected to the network 20. The managing server 30 provides a Web site for management which is accessed by a user, that is, the notebook PC 10 and when the user selects a battery diagnosis function at the Web site, the managing server 30 gives the user appropriate guidance on detailed diagnosis results and effective usages of a battery.

Figure 2:
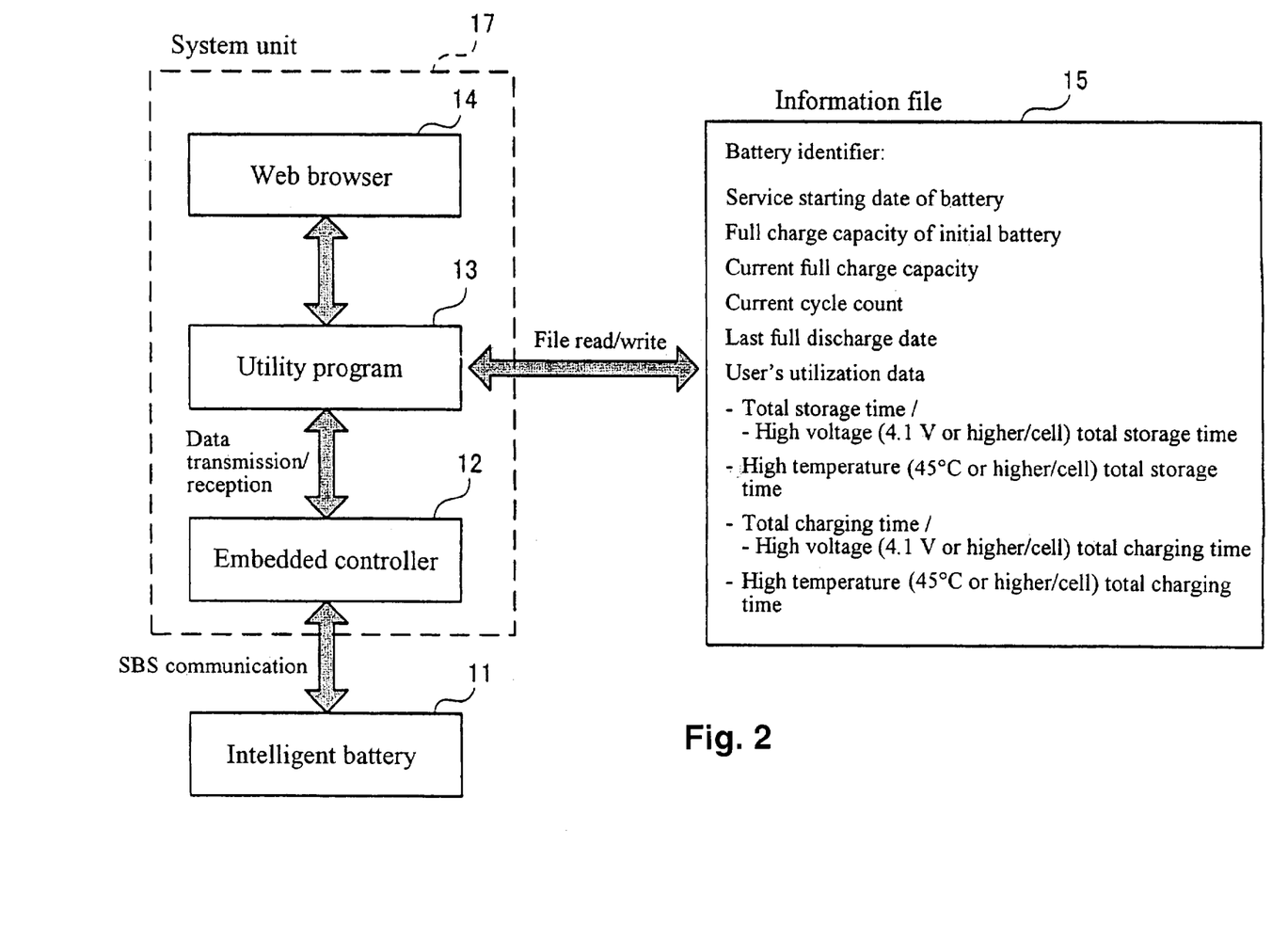
FIG. 2 shows the configuration of a notebook PC.

FIG. 2 shows the configuration of the notebook PC 10 and shows a main portion of the notebook PC 10 according to the embodiments of the present invention. The notebook PC 10 can be supplied with electric power by an intelligent battery 11 for a system unit 17 which executes various programs, input/output processing, and storage processing. The intelligent battery 11 is configured, for example, as a battery pack so that it can be mounted on and demounted from the system unit 17 of the notebook PC 10. The system unit 17 comprises an embedded controller 12 which is connected to an intelligent battery 11 or an AC adapter (not shown) through a built-in power management controller (PMC) for power management. A CPU (not shown) which functions as a brain of the notebook PC 10 executes a utility program 13 and a Web browser 14 in the system unit 17. In addition, the system unit 17 further comprises an information file 15 which stores a variety of information about the intelligent battery 11.

The intelligent battery 11 comprises a battery (secondary battery, storage battery) consisting of a plurality of cells, such as a nickel metal hydride battery cells or lithium-ion battery cells, which is used by repeating charges and discharges. The intelligent battery 11 also comprises its internal CPU (not shown). The internal CPU monitors the status of the intelligent battery 11 and stores a variety of information pieces about the battery and then transmits the variety of information to the embedded controller 12, for example, through Smart Battery System (SBS) compatible communication. Namely, the embedded controller 12 reads the variety of information about the battery from the internal CPU of the intelligent battery 11 through a SBS protocol, for example, at regular intervals. The intelligent battery 11 may be substituted by a "dumb" battery which has no internal CPU. In such a case, the variety of information indicating the status of the dam battery is directly monitored by embedded controller 12 through a current measurement circuit or a voltage measurement circuit each of which is provided separately.

The utility program 13 receives the variety of information about the intelligent battery 11 from the embedded controller 12 and stores it as the information file 15. The information file 15 is information to be stored in a predetermined memory provided for the system unit 17 of the intelligent battery 11. The user who operates the notebook PC 10 uses the Web browser 14 to access the managing server 30 which is a server for battery diagnosis and then receives an HTML document from the managing server 30 as a result of the access. The Web browser 14 requests the managing server 30 to start a Common Gateway Interface (CGI) program (described later) specified in the HTML document (it actually requests a URL address) and then transmits the variety of information about the intelligent battery 11 stored in the information file 15 to the CGI program of the managing server 30. Subsequently, the results of an analysis performed by the CGI program of the managing server 30 are transmitted by the managing server 30 to the Web browser 14 and the Web browser 14 displays the received analytical results.

In addition to the identifier of the intelligent battery 11, the information file 15 stores the service starting date of the intelligent battery 11, the full charge capacity of an initial battery (that is, the full charge capacity when the intelligent battery 11 starts to service), a current full charge capacity, a current cycle count, the last full discharge date, and the user's utilization data. The service starting date of the intelligent battery 11 is stored, for example, when the intelligent battery 11 is inserted into the system unit 17 as a battery pack and then the power is turned on.

In order to know how the intelligent battery 11 is degraded, a full charge capacity (FCC) which indicates a current full charge capacity can be used. Namely, the degree of battery degradation can be known from changes in FCC of the battery. The FCC is updated (learned) by fully discharging the battery to a capacity of substantially 0% (for example, approximately 3%) and can numerically represent the degree of battery degradation such as cycle degradation or storage degradation when the initial capacity is supposed as 100% (as described later). The full charge capacity of the initial battery can be construed as a design capacity or an initial FCC stored in the memory.

A current cycle count is used to know the cycle degradation of a battery. The last full discharge date is effective in knowing the status of a battery accurately in order to determine an accurate FCC value or to know memory effects of a battery. For a lithium-ion battery, the user's utilization data includes, for example, a total storage time, a high voltage (4.1 V or higher/cell) total storage time, a high temperature (45 C or higher/cell) total storage time, a total charging time, a high voltage (4.1 V or higher/cell) total charging time, and a high temperature (45° C. or higher/cell) total charging time. When the managing server 30 takes and uses the information stored in the information file 15, the system can accept different tapes of batteries and it can know how the user has used the battery, and get a fact, for example, that a certain battery may have lower resistance to higher temperatures.

Next, the managing server 30 is described below.

Figure 3:
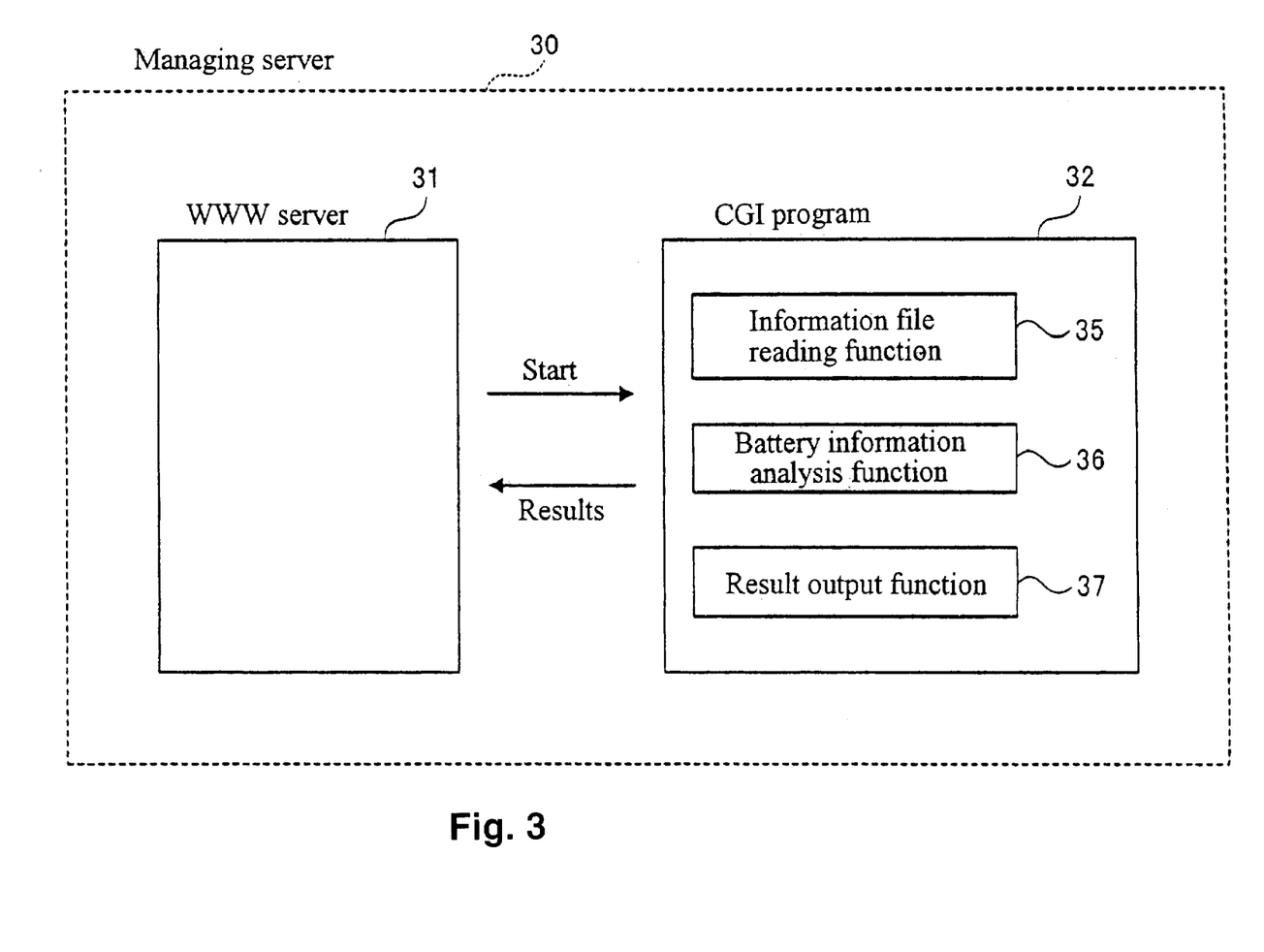
FIG. 3 shows the configuration of a managing server.

FIG. 3 shows the configuration of the managing server 30. The managing server 30 according to the embodiments comprises a WWW server 31 for receiving an analysis request from the notebook PC 10 through the network 20 and providing analytical results to the notebook PC 10 through the network 20 and a CGI program 32 for analyzing a battery and providing analytical results to the WWW server 31.

The WWW server 31 provides the notebook PC 10 with an HTML document for battery analysis when it is accessed by the notebook PC 10, and receives a request (URL address) from the notebook PC 10 to start the CGI program 32 specified in the HTML document. The WWW server 31 determines whether the received URL specifies the CGI program 32. If the CGI program 32 is specified, the WWW server 31 starts the CGI program 32. It may be possible to find the CGI program by noticing an extension "cgi." However, there may be other different ways to find the CGI program depending on the setting of the managing server 30 or the provider.

The CGI program 32 is written in a script language, for example, Practical Extraction and Report Language (Perl). If it is written in Perl, a standard module "CGI.pm" can be used to upload to the managing server 30 the information file 15 of the notebook PC 10 including battery information. The CGI program 32 comprises an information file reading function 35 for reading the information file 15 received on the WWW server 31, a battery information analysis function 36 for analyzing the intelligent battery 11 from a variety of information about the intelligent battery 11 read by the information file reading function 35 such as the service starting date of the intelligent battery 11, and a result output function 37 for providing analytical results from the battery information analysis function 36 as standard outputs. The output contents provided by the result output function 37 of the CGI program 32 are transmitted to the Web browser 14 of the notebook PC 10 through the WWW server 31 and the analytical results are displayed on the notebook PC 10 by the Web browser 14.

The battery information analysis function 36 of the CGI program 32 determines, for example, whether a battery is degraded. Battery degradation is basically determined from a ratio of a "current full charge capacity (FCC)" acquired from the information file 15 to a "full charge capacity of initial battery." Namely, the degree of battery degradation can be obtained from the following equations (1) and (2):

$$\text{(Full Charge Capacity Design Capacity) } 100[\%] \quad (1)$$

$$\text{(Full Charge Capacity Initial Full Charge Capacity Stored in the Memory) } 100[\%] \quad (2)$$

For example, according to the results of the equation (1), the user of the notebook PC 10 can be given any of the following guidance:

For 61 to 100%: The intelligent battery 11 is sufficiently serviceable and need no purchasing of nor replacing with a new battery.

For 31 to 60%: It is about time the user replace the intelligent battery 11.

For 0 to 30%: It is recommendable to replace the battery.

Diagnosis of a battery failure due to a degraded cell can be performed by comparing its current capacity with its guaranteed capacity taken from a table which lists guaranteed capacities with respect to cycle counts. When it is determined, from the service starting date data on the intelligent battery 11, that the battery is under warranty, an instruction to deliver a replacement battery to the user can be given. There may also be an instruction for the user to perform full discharge of the battery when it is determined, based on the last full discharge date, that there is a possibility of memory effect occurrence. One example for this is the case where a nickel metal hydride battery or nickel cadmium battery has been used for one month or more since the last full discharge date, which probably results in memory effect occurrence.

If the battery degradation has worsened, possible causes can be determined from the user's utilization data. In general, a battery may be degraded progressively in a high-temperature environment or during a prolonged high-voltage period. Therefore, main factors for the degradation can be determined by diagnosing the ratio of high temperature time or high voltage time to total storage time (with no charges nor discharges) or the ratio of high temperature charging time or high voltage charging time to total charging time.

Figure 4:
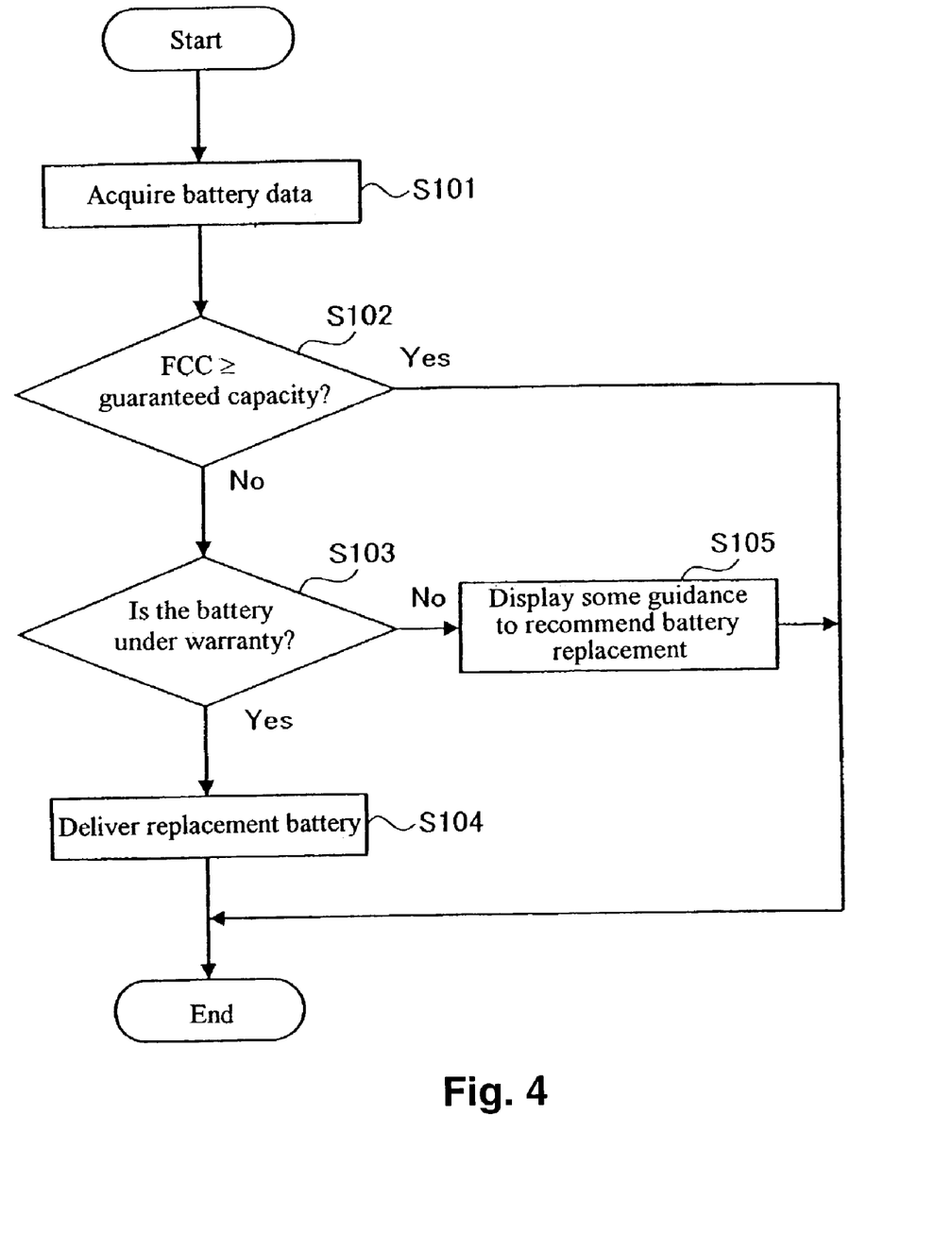
FIG. 4 shows a first example of the process to be performed by a CGI program of the managing server.
Figure 5:
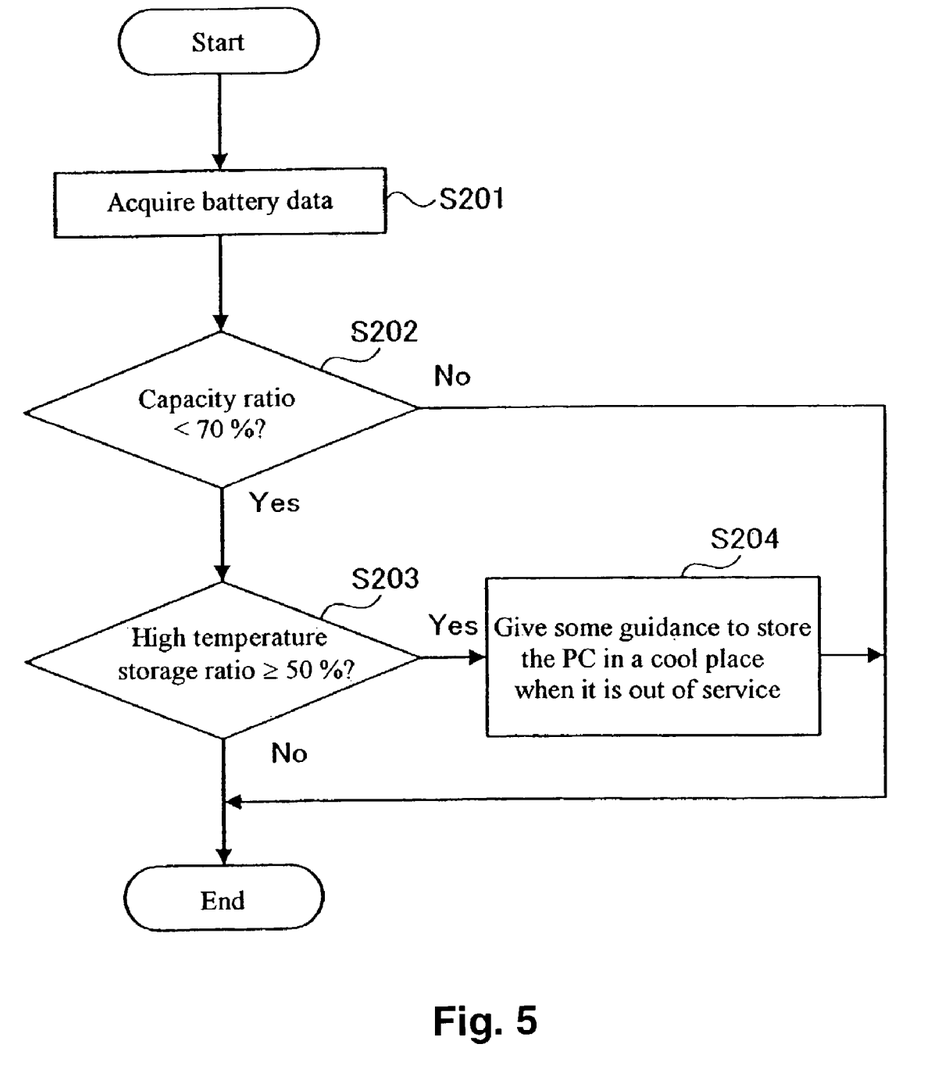
FIG. 5 shows a second example of the process to be performed by the CGI program of the managing server.
Figure 6:
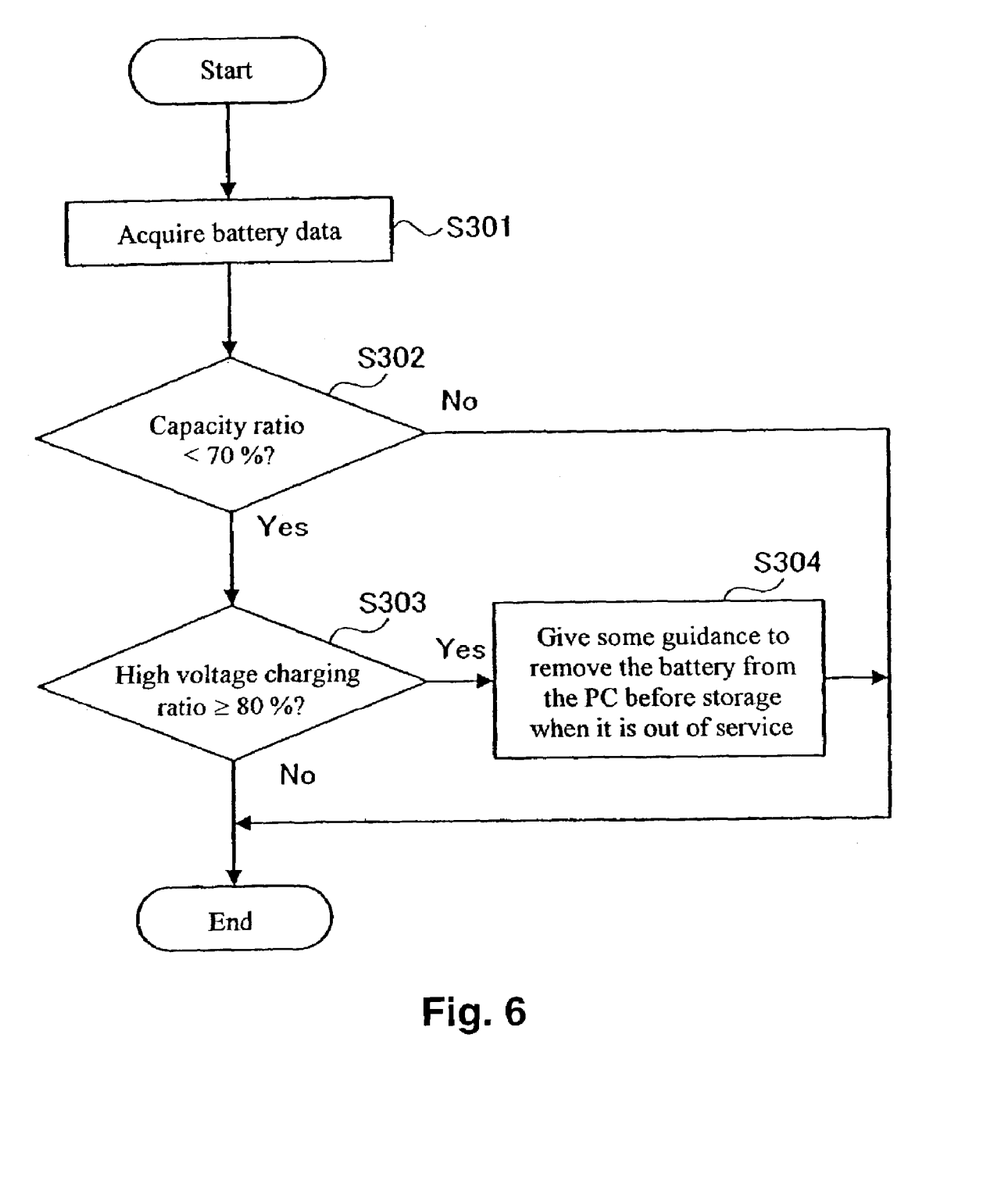
FIG. 6 shows a third example of the process to be performed by the CGI program of the managing server.

FIGS. 4 through 6 show examples of the processes to be performed by the CGI program 32 of the managing server 30. A first example shown in FIG. 4 shows an analysis process which is based on the relationship between full charge capacity and warranty period. In this example, some data about the intelligent battery 11 is first acquired by the information file reading function 35 (step 101). Then, it is determined by the battery information analysis function 36 whether the acquired FCC value is more than a predetermined guaranteed capacity (step 102). If the FCC value is more than the guaranteed capacity, the process will end and, for example, a "no problem" result output is provided by the result output function 37. In some cases, no result output may be provided if there is no problem.

If the FCC is less than the guaranteed value at step 102, it is determined whether the battery is under warranty from the manufacturer of the notebook PC 10 (for example, a one-year warranty since the service starting date of the battery) (step 103). If the battery is under warranty, delivery information for battery replacement is provided to deliver a replacement battery (step 104) and then the process will end. Namely, communication with a replacement battery delivery system automatically takes place and then a replacement intelligent battery 11 is delivered, for example, by a distribution center to the user of the notebook PC 10. In this case, the result output function 37 may be configured to provide some result information, for example, "a replacement battery will be delivered within a week." If the battery is out of warranty at step 103, a result output that some guidance should be displayed to recommend battery replacement is provided by the result output function 37 (step 105). These result outputs from the result output function 37 are provided to the notebook PC 10 through the WWW server 31 and the network 20.

A second example shown in FIG. 5 shows an analysis process which is based on acquired data about service conditions of the notebook PC 10. In this example, as in the case of the first example, some data about the intelligent battery 11 is first acquired by the information file reading function 35 (step 201). Then, it is determined by the battery information analysis function 36 whether a capacity ratio obtained by the above-described equation (1) or (2) is less than, for example, 70% (step 202). The capacity ratio of 70% is used as a reference, because the intelligent battery 11 with, for example, a one-year warranty will have a capacity ratio of approximately 70% after it operates approximately 150 cycles for a year. In this example, this reference is used to make a certain determination when the capacity ratio is less than 70%. However, this value may be selected arbitrarily.

If the capacity ratio is more than 70% at step 202, the process will end and, for example, a "no problem" result output is provided by the result output function 37. If the capacity ratio is less than 70% at step 202, service time data is collected at a specific range of temperatures. Namely, it is determined whether a high temperature (45° C. or higher) storage ratio (ratio of high temperature time) is 50% or more (step 203). If it is less than 50%, the battery condition in a high-temperature environment does not exceed the threshold and then the process may end and, for example, according to the capacity ratio of the battery, a result output such as "it is about time to replace the battery" or "replace the battery" may be provided. If the high temperature storage ratio is 50% or more at step 203, it is determined that the user's notebook PC 10 is often used in a high-temperature environment and a result output is performed by the result output function 37, to provide guidance for instructing to store the PC in a cool place when it is out of service (step 204). These result outputs provided by the result output function 37 are provided to the notebook PC 10 through the WWW server 31.

It can be understood from step 204 that the intelligent battery 11 of the notebook PC 10 has been degraded during a prolonged high temperature storage time and that such a high ambient temperature is one of possible factors for the degradation. Therefore, battery characteristics and factors for degradation can be determined by collecting and analyzing plenty of data on the user's utilization and thus, this data can be put to effective use in selecting or developing batteries for future products.

A third example shown in FIG. 6 shows an analysis process which is based on acquired data about the user's utilization of a battery. In this example, as in the case of the second example, some data about the intelligent battery 11 is first acquired by the information file reading function 35 (step 301). Then, it is determined by the battery information analysis function 36 whether a capacity ratio obtained by the above-described equation (1) or (2) is less than, for example, 70% (step 302). If the capacity ratio is more than 70%, the process will end and, for example, a "no problem" result output is provided by the result output function 37. If the capacity ratio is less than 70% at step 302, service time data is collected at a specific range of voltages. Namely, it is determined whether a high voltage (4.1 V or higher) charging ratio (ratio of high voltage storage time) is 80% or more (step 303). If it is less than 80%, it is determined that the battery operates acceptably and then the process may end and, for example, according to the capacity ratio of the battery, a result output such as "it is about time to replace the battery" or "replace the battery" may be provided. If the high voltage charging ratio is 80% or more at step 303, the battery degradation may occur because the user hardly causes the PC to perform battery-powered operations. Then a result output is performed by the result output function 37, to provide guidance for instructing to remove the battery from the PC before storage when it is out of service (step 304). These result outputs provided by the result output function 37 are provided to the notebook PC 10 through the WWW server 31. As in the case of the second example, data on the user's utilization can be stored for analysis and put to effective use in selecting or developing batteries for future products.

In the above-described example, the notebook PC 10 accesses the WWW server 31 provided for the managing server 30 to get a diagnosis of the intelligent battery 11. Alternatively, the user of the notebook PC 10 may transmit to the managing server 30 an e-mail message with the information file 15 attached thereto and ask the managing server 30 to analyze the information about the intelligent battery 11 and to return the analytical results to the notebook PC 10 by e-mail.

In another embodiment, Java Script may be used to prompt the user of the notebook PC 10 to enter a variety of information about the intelligent battery 11 and then the user will enter each item of data about the intelligent battery 11 as indicated by the utility program 13. When all information has been entered, the CGI program 32 is started to analyze the intelligent battery 11 and then analytical results are displayed by the Web browser 14 on the notebook PC 10.

The CGI program 32 does not necessarily have to be written in Perl and it may be written in any one selected from C, Visual Basic, or other appropriate languages. In addition, instead of CGI, Server Side Include (SSI) or other equivalents may be used to implement the functions described above.

As described above, in the embodiments of the present invention, the intelligent battery 11 comprises the function for recording the date when the user starts to use it for the purpose of determining the warranty period, the function for logging the user's utilization, and the function for transmitting such information to the managing server 30 when the user accesses the managing server 30. On the other hand, the managing server 30 comprises the function for diagnosing the intelligent battery 11 and the function for automatically communicating with the delivery system for replacement batteries when it is determined that a failed battery is still under warranty. This configuration can provide the user with appropriate guidance on detailed diagnosis results and effective usages of the intelligent battery 11, when the user accesses an Internet site (managing server 30) through the notebook PC 10 and selects the battery diagnosis function.

The embodiment of the present invention is configured to collect historical data such as "service time at a specific range of temperatures" or "service time at a specific range of voltages" both of which are not usually displayed on the notebook PC 10, in order to give appropriate guidance for the user to make use of the intelligent battery 11 comfortably. Furthermore, such data is analyzed to determine possible factors for degradation of the intelligent battery 11 and to create a database of battery-specific degradation factors. Based on the created database, guidance to be given to the user can be dynamically optimized. For example, if the intelligent battery 11 does not demonstrate a sufficient capacity at high temperatures and it is determined that the user has used it in a high-temperature environment for a long time, some guidance to lower the temperature with an air conditioner may be given to the user. In addition, the created database may be exploited for future improvement in battery characteristics.

The embodiment of the present invention is configured to conduct a fault diagnosis of the intelligent battery 11 and to automatically link the delivery system if the battery is under warranty, in order to deliver a replacement battery to the user. In the above-described embodiment, by way of example, the battery's service starting date stored in the information file 15 is used to determine whether it is under warranty, and alternatively, for example, the intelligent battery 11 may transmit to the managing server 30 some identification data such as a serial number to cause the managing server 30 to determine the warranty period from the user registration data. The destination for a replacement battery may be acquired by prompting the user to enter it on the Web site. Otherwise, the destination may also be acquired by transmitting some identification data for the intelligent battery 11 or the system unit 17 to the managing server 30 to search the user registration data for the postal address.

In the above description, the notebook PC 10 supplied with electric power by the intelligent battery 11 is described by way of example, but the present invention is not limited to that embodiment and it can find wide applications in electrical apparatuses to be supplied with electric power through charges and discharges, without departing from the range and sprit of the present invention. For example, the present invention is widely applicable to various home appliances which can be connected to a home network, audio apparatuses, and various information terminal apparatuses developed for personal use.

In the drawings and specifications there has been set forth a preferred embodiment of the invention and, although specific terms are used, the description thus given uses terminology in a generic and descriptive sense only and not for purposes of limitation.

What is claimed is:

1. Apparatus comprising:
    a network; an electrical apparatus connected to said network and having a battery which performs charges and discharges to supply electric power to the electrical apparatus; and
    a managing server connected to said network and performing a diagnosis of said battery provided for said electrical apparatus;
    wherein said electrical apparatus accesses a Web page provided by said managing server through said network and then transmits an information file about said battery to said managing server, and
    wherein said managing server reads said information file to analyze the information about said battery, maintains a database of collected historical data, transmits the analytical results to said electrical apparatus, and provides guidance to a customer for effective usage of said battery, based on said collected historical data.

2. The apparatus according to claim 1, wherein said managing server analyzes the status of said battery and determines whether said battery is under warranty.

3. The apparatus according to claim 2, wherein said managing server determines whether said battery is under warranty, based on some information about the service starting date of said battery which is stored in said information file.

4. The apparatus according to claim 1, wherein said electrical apparatus stores into said information file the full charge capacity of said battery which is obtained from said battery, and then transmits the full charge capacity of said battery to said managing server.

5. The apparatus according to claim 1, wherein said electrical apparatus uses a browser to access the Web page which is provided by said managing server, and specifies a URL which exists in an HTML document transmitted by said managing server to have a diagnosis of said battery performed by said managing server.

6. Apparatus comprising:
    a managing server which performs through a network a diagnosis of a battery connected to an electrical apparatus, said server having: an information file reader which reads an information file about the battery which is stored in the electrical apparatus;
    a battery information analyzer which performs an information analysis including a fault diagnosis and/or a degradation diagnosis of the battery, based on the information file read by said information file reader; and
    a result output module which provides analytical results from said battery information analyzer to said electrical apparatus and provides guidance to a customer for effective usage of said battery, based on collected historical data.

7. Apparatus according to claim 6, wherein said battery information analyzer compares a current full charge capacity acquired from the information file with a predetermined guaranteed capacity to perform a fault diagnosis of the battery.

8. Apparatus according to claim 7, wherein said battery information analyzer acquires information about the service starting date of the battery from the information file and determines whether it is under warranty.

9. Apparatus according to claim 6, wherein said battery information analyzer acquires from the information file information about high temperature storage time and/or high voltage charging time and determines a battery degradation factor, based on such acquired information about high temperature storage time and/or high voltage charging time.

10. Apparatus according to claim 6, wherein said result output module provides analytical results to said electrical apparatus in order to give guidance in storage of said battery to the user.

11. An electrical apparatus comprising:
battery information acquisition means for acquiring a variety of information about a battery which supplies electric power to the electrical apparatus;
storage means for storing as an information file the variety of information about said battery which is acquired by said battery information acquisition means;
transmission means for transmitting, to a managing server through a network, said information file stored by said storage means; and
reception means for receiving, from said managing server through said network, analytical results based on said information file transmitted by said transmission means, said analytical results comprising guidance to a customer for effective usage of said battery, based on collected historical data.

12. The electrical apparatus according to claim 11, wherein said storage means stores, as said information file, some information used to perform a fault diagnosis of said battery and some information used to determine whether said battery is under warranty.

13. The electrical apparatus according to claim 11, wherein said storage means stores, as said information file, some information about service time at a specific range of temperatures and/or service time at a specific range of voltages.

14. A method comprising the steps of:
acquiring information useful in performing a degradation diagnosis of said battery and information useful in determining a degradation factor for said battery;
storing said acquired information;
transmitting said stored information through a network to a managing server which performs a diagnosis and a status determination of said battery, and providing guidance to a customer for effective usage of said battery, based on collected historical data; and
receiving the results of a degradation diagnosis and/or a degradation factor determination from said managing server through said network.

15. The battery status managing method according to claim 14, wherein the information used for said degradation diagnosis is full charge capacity information of said battery and the information used for said degradation factor determination is usage information at a specific range of temperatures and/or usage information at a specific range of voltages.

16. A battery diagnosis method for performing a diagnosis of a battery provided for an electrical apparatus connected through a network, comprising the steps of:
reading an information file about said battery which is acquired through said network; comparing a full charge capacity of said battery which is acquired from said read information file with a predetermined guaranteed capacity;
determining whether said battery is under warranty, if the full charge capacity of said battery is lower than said guaranteed capacity; and
performing a process for battery replacement, if said battery is under warranty, and providing guidance to a customer for effective usage of said battery, based on collected historical data.

17. The battery diagnosis method according to claim 16, wherein said process for battery replacement is to provide delivery information for said battery.

18. A battery diagnosis method for performing a diagnosis of a battery provided for an electrical apparatus connected through a network, comprising the steps of:
reading an information file about said battery which is acquired through said network;
collecting historical data for said battery which is acquired from said read information file; and
providing to said electrical apparatus through said network guidance to the customer for effective usage of a battery, based on said collected historical data.

19. The battery diagnosis method according to claim 18, wherein said historical data to be collected for said battery is data for service time of said battery at a specific range of temperatures and/or data for service voltage of said battery at a specific range of voltages.

20. A program for causing a computer which performs a diagnosis of a battery provided for an electrical apparatus connected through a network to implement the functions for:
reading an information file about said battery which is acquired through said network;
comparing a full charge capacity of said battery which is acquired from said read information file with a predetermined guaranteed capacity;
determining whether said battery is under warranty, if the full charge capacity of said battery is lower than said guaranteed capacity; and
performing a process for battery replacement, if said battery is under warranty, and providing guidance to a customer for effective usage of said battery, based on collected historical data.

21. A program for causing a computer which performs a diagnosis of a battery provided for an electrical apparatus connected through a network to implement the functions for:
reading an information file about said battery which is acquired through said network;
collecting historical data for service time and/or service voltage of said battery which is acquired from said read information file; and
providing to said electrical apparatus through said network guidance to the customer for effective usage of a battery, based on said collected historical data.

* * * * *